United States Patent [19]

Hase et al.

[11] Patent Number: 4,758,870
[45] Date of Patent: Jul. 19, 1988

[54] SEMICONDUCTOR DEVICE

[75] Inventors: Ichiro Hase, Tokyo; Hiroji Kawai, Kanagawa; Shunji Imanaga, Kanagawa; Kunio Kaneko, Kanagawa, all of Japan

[73] Assignee: Director-General of the Agency of Industrial Science & Technology Itaru Todoriki, Tokyo, Japan

[21] Appl. No.: 713,636

[22] Filed: Mar. 19, 1985

[30] Foreign Application Priority Data

Oct. 26, 1984 [JP] Japan .................................. 59-224090

[51] Int. Cl.[4] ............................................ H01L 29/72
[52] U.S. Cl. ......................................... 357/34; 357/16; 357/58; 357/61
[58] Field of Search ..................... 357/16, 34, 58, 61

[56] References Cited

U.S. PATENT DOCUMENTS 4,485,391 11/1984 Poulain et al. ......................... 357/16
4,608,586 8/1986 Kim .................................... 357/16

Primary Examiner—Edward J. Wojciechowicz
Attorney, Agent, or Firm—Hill, Van Santen, Steadman & Simpson

[57] ABSTRACT

A III-V semiconductor device is disclosed, which includes an emitter region, an emitter barrier region having such a barrier height as to substantially restrict a thermionic emission current as compared with a tunneling current and such a barrier width as to permit the tunneling current, a base region containing indium and having higher electron affinity than said emitter region and a collector barrier region having such a barrier height as to substantially prohibit a thermally distributed electron from overflowing and such a barrier width as to substantially prohibit the tunneling current.

1 Claim, 8 Drawing Sheets

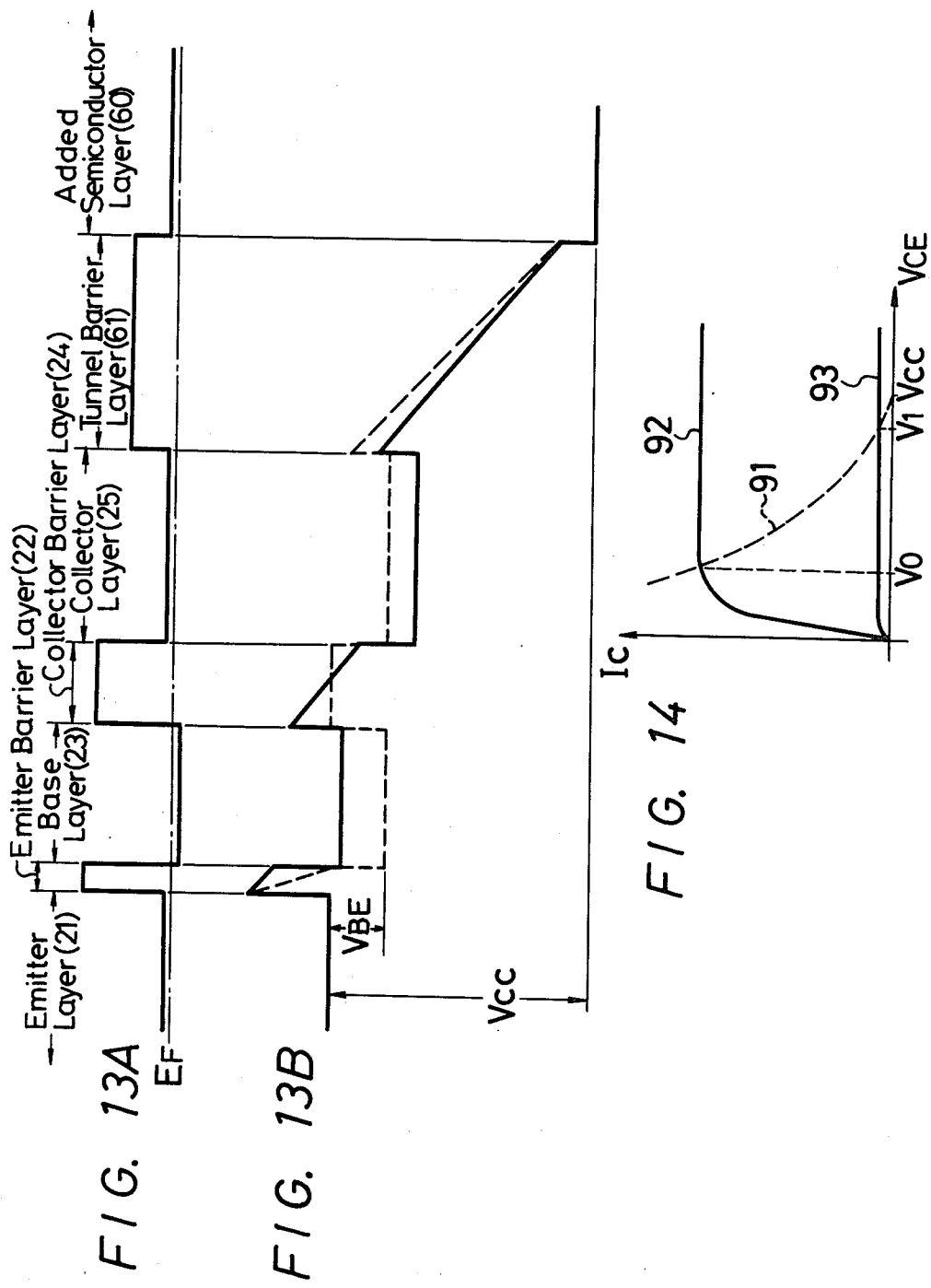

SEMICONDUCTOR DEVICE

BACKGROUND OF THE INVENTION

1. Field of the Invention

This invention relates generally to semiconductor devices and, in particular, is directed to a semiconductor device, for example, a hot electron transistor.

2. Description of the Prior Art

Recently, in accordance with a remarkable increase of information processing, it is strongly requested to realize a logic element which can operate at higher speed. In the prior art, such a high speed logic element has been realized so far by fine-processing and highly or largely integrating a silicon device.

At the same time, a high speed logic element has been earnestly developed by using a compound semiconductor having a high electron mobility such as GaAs and so on. However, the realization of the high speed logic element by using a two dimensional fine processed silicon device arrives at its limits and a rapid progress for realizing such a high speed logic element by this method can no longer be expected.

On the other hand, as a ultra-high speed logic element, various kinds of transistors have been proposed, which can operate on the basis of different operation principles from those of an ordinary field effect transistor (FET) and a bipolar transistor, and a hot electron transistor (hereinafter simply referred to as HET) is typically enumerated as one of such transistors.

FIG. 1 is a cross-sectional view illustrating the fundamental structure of an example of the prior art HET. As shown in FIG. 1, the HET is formed of, for example, a high-doped n-type GaAs emitter layer 1, an intrinsic AlGaAs emitter barrier layer 2, n-type GaAs base layer 3, an intrinsic AlGaAs collector barrier layer 4 and a high-doped n-type GaAs collector layer 5. In FIG. 1, reference letters E, B and C designate an emitter terminal, a base terminal and a collector terminal of the HET, respectively.

In this HET, the emitter terminal E is grounded and the collector terminal C is applied with a voltage +Vcc. When a predetermined on-state voltage $V_{BE}$ is applied between the emitter terminal E and the base terminal B, a majority carrier (electron) is injected from the emitter layer 1 to the base layer 3. FIG. 2A and 2B are respectively diagrams schematically showing the bottom energy level of a conduction band of this HET, in which a one-dot chain line indicates Fermi level $E_F$. FIG. 2A schematically illustrates a state in which no voltage is applied to each terminal. FIG. 2B schematically illustrates a state in which a voltage Vcc is applied between the emitter E and the collector C with the collector C side being positive in polarity. In FIG. 2B, a broken line indicates a state in which no voltage is applied between the emitter E and the base B, and a solid line indicates a state in which the predetermined on-state voltage $V_{BE}$ is applied between the emitter E and the base B with the base B side being positive in polarity. Under the state that the voltages Vcc and $V_{BE}$ are respectively applied to the HET, as shown by the solid line in FIG. 2B, a tunneling or thermionic emission is generated by the majority carrier (electron) which respectively tunnels through or overflows the emitter barrier layer 2, and this majority carrier is injected into the base layer 3. In this case, the emitter barrier layer 2 is made to have such a barrier height h as to substantially neglect the thermionic emission current as compared with the tunneling current. At this time, under the state that the on-voltage $V_{BE}$ is applied across the emitter E - base B path, the electron with large kinetic energy injected into the base layer 3, or a so-called hot electron is directed to run toward the collector layer 5. At this time, a part of the electron is changed in its transport direction and loses its energy due to the scattering in the base layer 3, and is dropped to the bottom of the conduction band of the base layer 3, which then becomes a base current $I_B$. Other electron reaching to the collector layer 5 over the collector barrier layer 4 becomes a collector current $I_C$. At this time, the emitter current $I_E$ is expressed as $I_E = I_B + I_C$ and a current gain $\beta$ is given by the following equation.

$$\beta = I_C/I_B$$

Under the state that the voltage $V_{BE}$ is not applied across the base B - emitter E path, the emitter barrier layer 2 becomes large in thickness as shown by a broken line in FIG. 2A so that the carrier becomes difficult to tunnel from the emitter layer 1 to the base layer 3, thus the number of the injected carrier being reduced. Further, the collector barrier layer 4 becomes high in barrier height h for the injected carrier so that the transport of the carrier toward the collector layer 5 is blocked, thus the collector current $I_C$ being suppressed. As a result, depending on the voltage applied to the base terminal B, the HET is turned on and off similarly to the ordinary transistor operation.

In order to have a large current gain $\beta$ in this HET arranged as mentioned above, the width (thickness) of the base layer 3 is desired to be made as small as possible so as to obtain as high transfer ratio as possible. If, however, the thickness of the base layer 3 is reduced, the amount of the carrier in the base layer 3 is reduced so that the resistance in the base layer 3 becomes large. Consequently, the base voltage applied to the base layer 3 becomes difficult to be applied to its whole base area and also there arises a defect that the ohmic contact of the output terminal with the base layer 3 will become difficult to be made.

While the mobility of electron in GaAs becomes high in the Γ band, a scattering probability thereof becomes high in a band of high energy level, namely, X band and L band. FIG. 3 illustrates a scattering probability of GaAs with respect to the electron energy at 300° K. In FIG. 3, a curve 7 indicates a scattering probability of an electron scattered from Γ band to X band. From the curve 7, it will be clear that when the electron energy exceeds an upper valley, or the levels of the X band and L band, the scattering of the electron from the Γ band to the X band or from the Γ band to the L band becomes rapidly large. Since the scattering of this kind changes the direction of the injected electron irregularly, this scattering is very harmful for the transport of the electron, lowering the mobility of the electron. In FIG. 3, a curve 8 indicates a scattering of an optical photon. As will be clear from the curve 8, although a large scattering probability is exhibited in the low energy side, the scattering takes the form of a small angle so that the influence for the electron transport is substantially small. Accordingly, when GaAs is used as the base layer, while the scattering of the electron depends on the thickness of the base layer, in order to efficiently reduce the scattering, the energy of the electron injected from the emitter layer is desired not to exceed the energy of the upper valley (normally in a range from 0.31 to 0.35 eV). To this end, firstly the barrier height h of the collector barrier layer must be selected not higher than 300 meV, which is less than the energy of the upper valley and, for example, 200 meV.

In the transistor operation, however, a breakdown voltage between the base B and collector C becomes a serious factor. More particularly, when in the HET a voltage is applied between the base B and the collector C, if the breakdown voltage between the base B and the collector C is zero or very small, a thermally disturbed electron overflows to the collector layer from the base layer through the collector barrier layer which then allows the collector current to flow regardless of a base potential, thus the HET no longer carries out the so-called transistor operation.

FIG. 5 illustrates a current versus voltage characteristic of a diode with GaAs/AlGaAs/GaAs triple-layer structure as shown in FIG. 4 under the condition that the thickness of the AlGaAs layer used as a barrier layer in the diode is selected to be 500 Å. In FIG. 5, curves 9, 10, 11 and 12 indicate current versus voltage characteristics with the barrier height h of the barrier layer being selected as h=350 meV, h=300 meV, h=250 meV and h=200 meV, respectively. From FIG. 5, it will be seen that if, at 0.5 V, a leakage current thereof is suppressed to be not higher than 1 Å/cm$^2$, the barrier height or the height h of the collector barrier in the transistor must be selected to be not lower than 300 meV. Under low temperature of 77° K., it is necessary to select the height h of the collector barrier as 150 meV.

As described above, with respect to the breakdown voltage between the base B and the collector C, it is desired that the barrier height h of the collector barrier is selected to be at least not lower than 300 meV. If, however, the height h of the collector barrier is merely increased, only the electron of high energy existing in the X band and L band can flow over the collector barrier so that the scattering probability of the electron becomes large and the current gain $\beta$ is lowered. Accordingly, in the conventional HET, the current gain $\beta$ is equivalent to the height of about 0.1 and this falls far short of the desired value of the current gain $\beta$ that the transistor is expected to have, for example, 10 to 100. In addition, due to the above-described factors such as the breakdown voltage and so on, the HET can only be used at low temperature of 77° K. so that this prior art HET can not be expected to operate at room temperature or high temperature near the room temperature.

OBJECTS AND SUMMARY OF THE INVENTION

Accordingly, it is an object of this invention to provide an improved semiconductor device, particularly hot electron transistor which can remove the shortcomings inherent in the prior art semiconductor device.

It is another object of this invention to provide a semiconductor device or hot electron transistor which can operate at room temperature or high temperature near the room temperature.

According to one aspect of the present invention, there is provided a III-V semiconductor device comprising:

an emitter region;

an emitter barrier region having such a barrier height as to substantially restrict a thermionic emission current as compared with a tunneling current and such a barrier width as to permit said tunneling current;

a base region containing indium and having higher electron affinity than said emitter region; and a collector barrier region having such a barrier height as to substantially prohibit a thermally distributed electron from overflowing and such a barrier width as to substantially prohibit said tunneling current.

These and other objects, features and advantages of the semiconductor device according to the present invention will become apparent from the following detailed description of the preferred embodiments taken in conjunction with the accompanying drawings, throughout which like reference numerals designate like elements and parts.

BRIEF DESCRIPTION OF THE DRAWINGS

FIGS. 13A and 13B are respectively diagrams of conduction band energy models useful for explaining the semiconductor device of FIG. 11; and FIG. 14 is an operation characteristic graph used to explain the operation of the semiconductor device of FIG. 11.

DESCRIPTION OF THE PREFERRED EMBODIMENTS

Now, the present invention will hereinafter be described with reference to the drawings.

Figure 1:
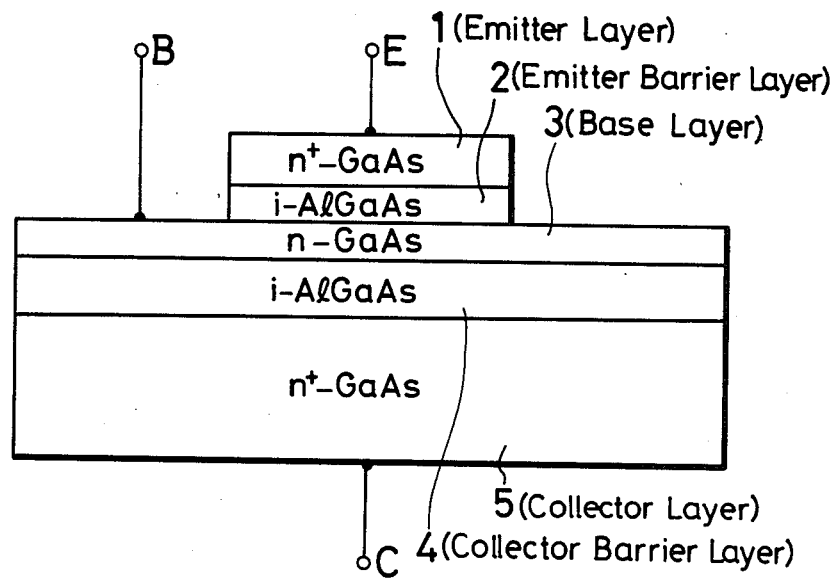
FIG. 1 is a schematic diagram showing an example of a prior art hot electron transistor.
Figure 2A:
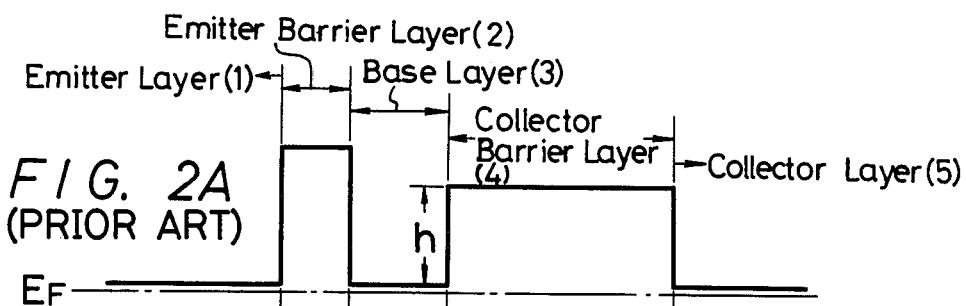
FIGS. 2A and 2B are respectively diagrams of a conduction band energy useful for explaining the prior art hot electron transistor of FIG. 1.
Figure 2B:
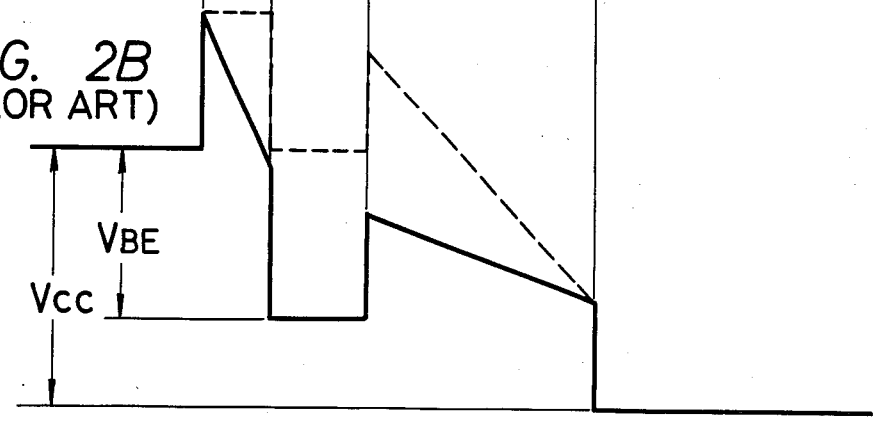
Figure 3:
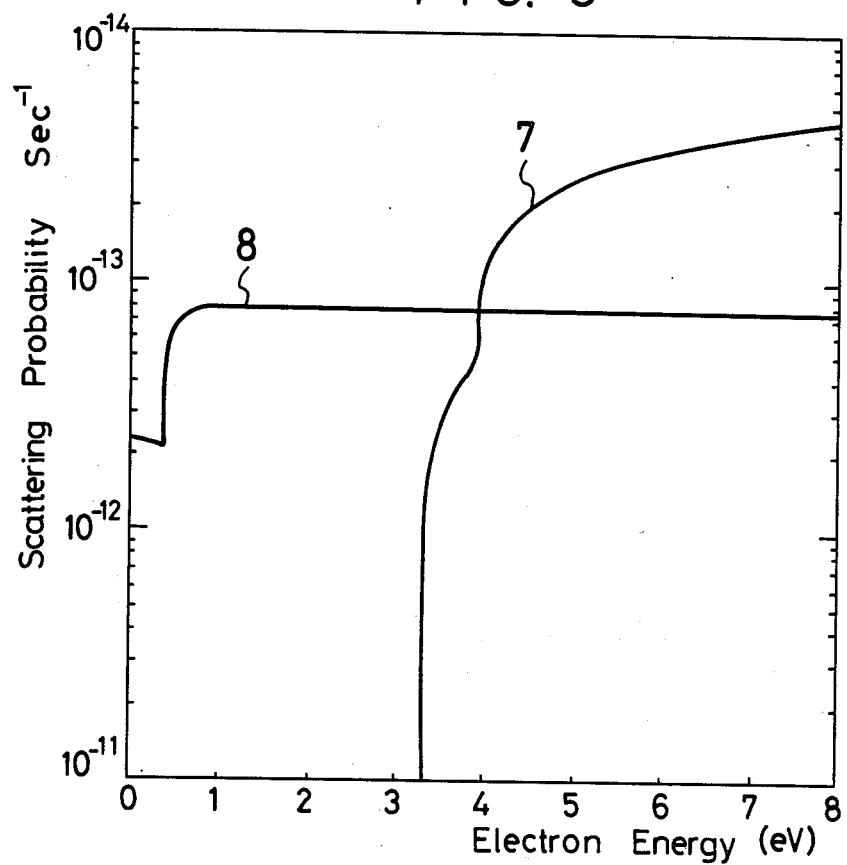
FIG. 3 is a graph showing a relation between an electron energy and a scattering probability.
Figure 4:
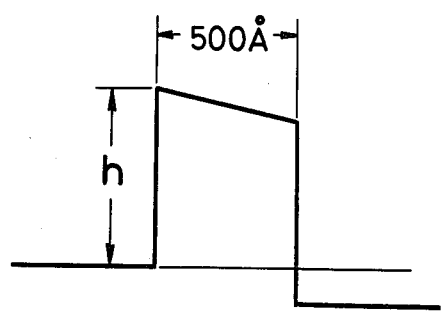
FIG. 4 is a diagram of an energy band model useful for explaining the prior art hot electron transistor which is formed as a diode.
Figure 5:
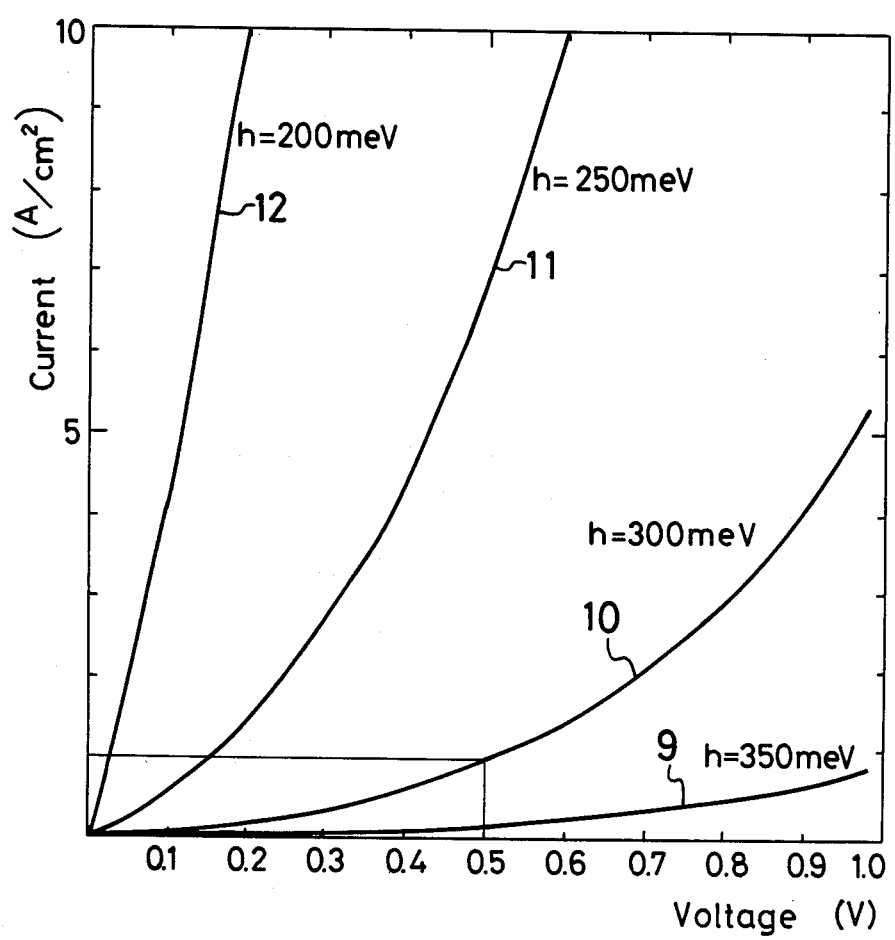
FIG. 5 is a graph of a voltage versus current characteristic of the hot electron transistor of FIG. 4.
Figure 6:
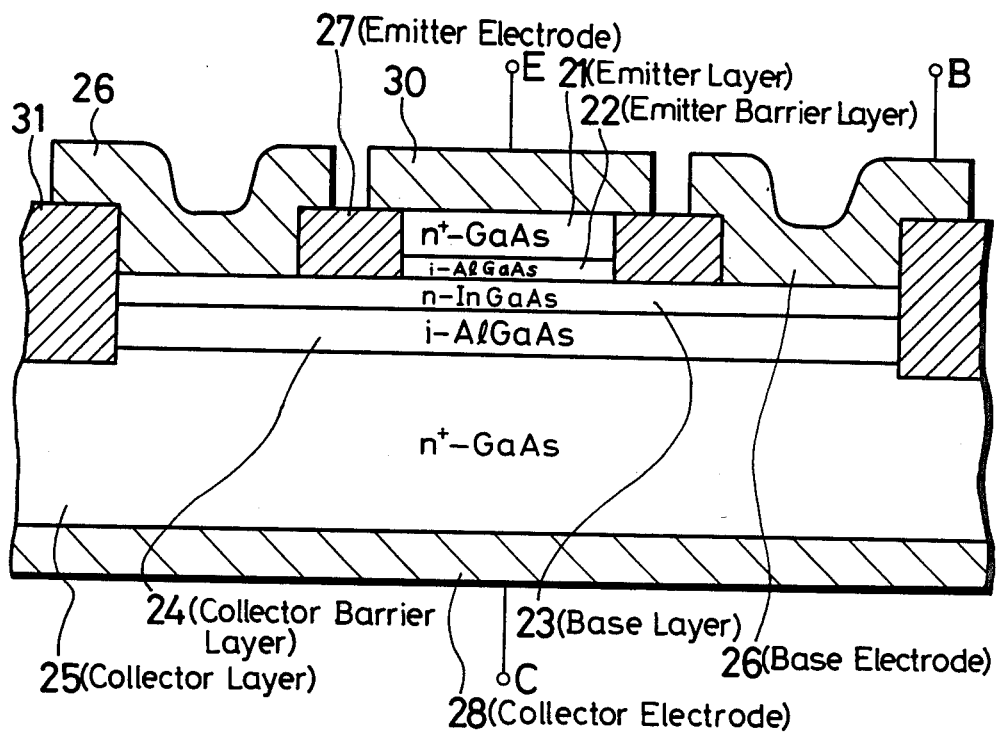
FIG. 6 is an enlarged cross-sectional view schematically illustrating an embodiment of the semiconductor device according to this invention.

FIG. 6 shows an embodiment of the semiconductor device according to this invention. As shown in FIG. 6, the semiconductor device or HET of this invention comprises an emitter layer 21, a base layer 23, a collector layer 25, an emitter barrier layer 22 formed between the emitter layer 21 and the base layer 23 and a collector barrier layer 24 formed between the base layer 23 and the collector layer 25, each of which is made of a compound semiconductor of group III - V or compound semiconductor layer expressed as $$In_x(Al_yGa_{1-y})_{1-x}P_zAs_{1-z} \quad (1)$$

Particularly, in the base layer 23, values x and y in Eq. (1) are selected so as to satisfy $0 < X \leq 1$ and $0 \leq y \leq 1$ and x in the base layer 23 is selected at least larger than x in the emitter layer 21. That is, the base layer 23 is formed of such compound that at least part of indium In is substituted for the metal of group III with a substituted amount larger than that in the emitter layer 21. In this way, the electron affinity, or the energy width from the vacuum level in the base layer 23 is made larger than that in the emitter layer 21.

Figure 7:
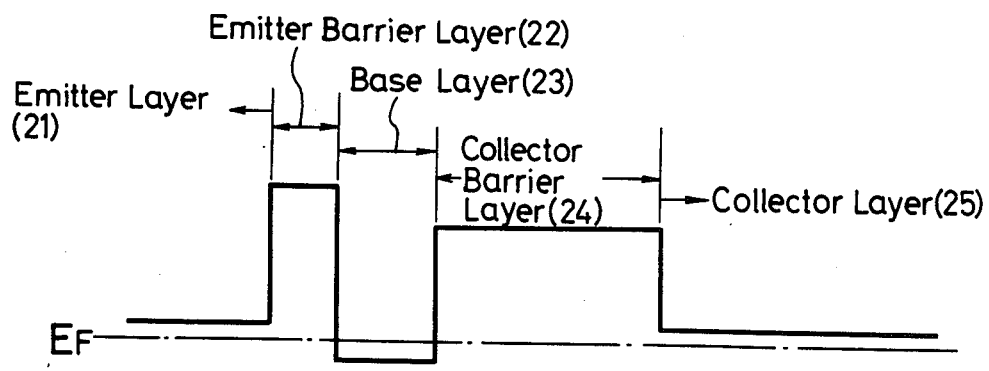
FIG. 7 is a diagram of a conduction band energy model useful for explaining the semiconductor device of FIG. 6.

FIG. 7 illustrates the band models of the bottoms of the conduction bands in the respective layers 21 to 25. From FIG. 7, it will be apparent that the bottom of the conduction band in the base layer 23 is selected at a position lower than the bottom of the conduction band in the emitter layer 21, or the position lower than, for example, Fermi level $E_F$ to thereby increase the amount of the carrier (electron) thereat.

Figure 8:
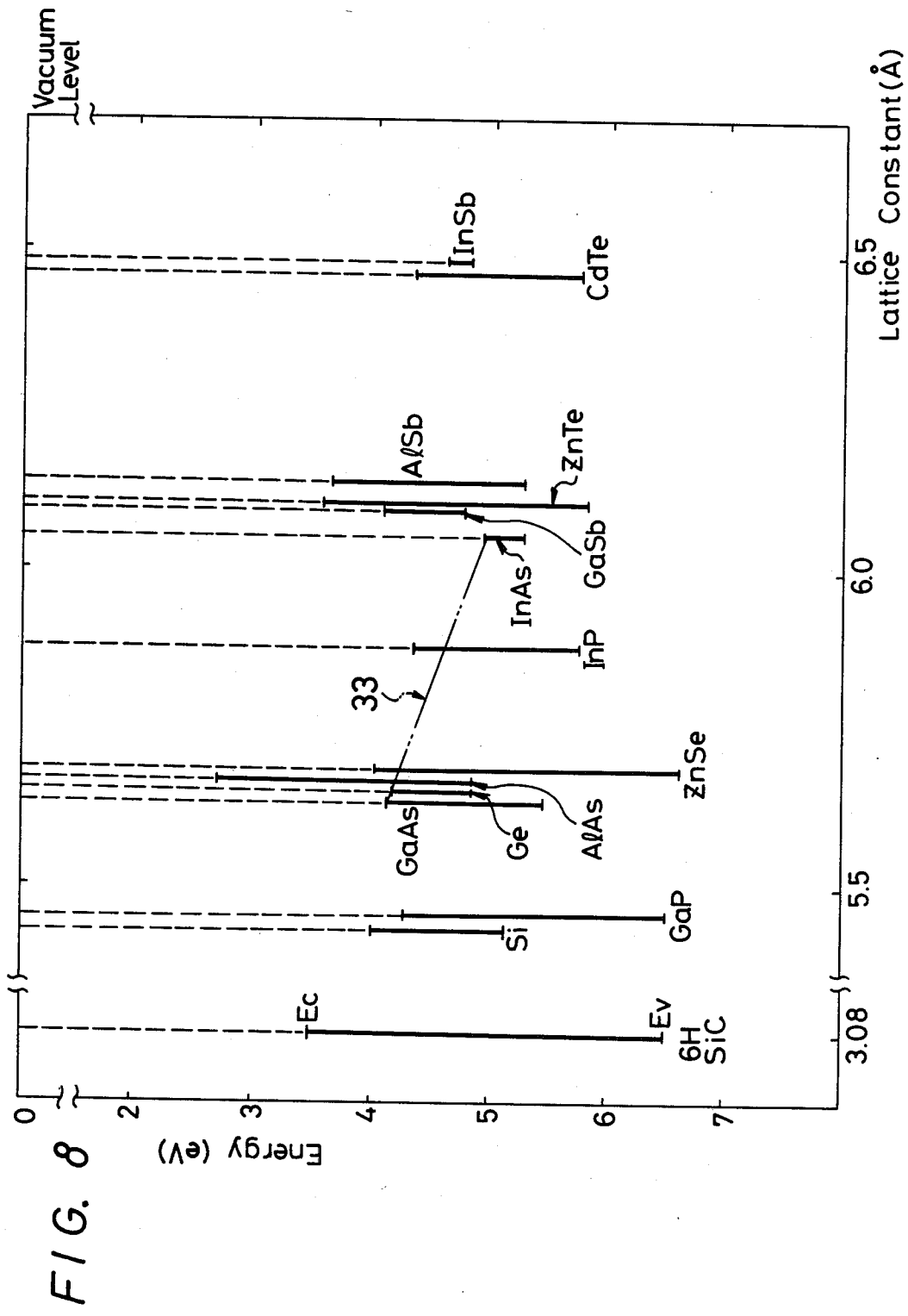
FIG. 8 is a graph showing lattice constants and energy values of energy bands of III - V group compounds.

FIG. 8 illustrates the lattice constants of a compounds of group III - V and the bottom energies of the conduction bands thereof. In FIG. 8, portions shown by broken lines indicate the conduction bands thereof and portions shown by solid lines indicate forbidden band widths, namely, energy band gaps, respectively. Accordingly, the lower ends of the solid lines indicate the energy positions of the upper ends of the valence bands. From FIG. 8, it will be clear that when, for example, respective compounds of GaAs and InAs of group III - V are compared with each other, the positon of the bottom of the conduction band of InAs is more distant from the vacuum level than the GaAs, or InAs has the larger electron affinity than that of GaAs. Accordingly, when the compound semiconductor of group III - V is formed by the mixed crystal of, for example, GaAs and InAs, depending on the mixed ratio therebetween, in other words, the ratio of the substituted amount of Ga and In, it becomes possible to select the conduction band of the mixed crystal to be a desired value on a two-dot straight line 33 which connects the positions of the bottoms of the conduction bands of GaAs and InAs.

It is known that while GaAs and InAs are not so largely different in energy at the L band and X bnad, InAs has a rather low energy level with respect to the Γ band as compared with GaAs.

As described above, according to this invention, since the base layer 23 is formed of the semiconductor layer containing indium In of large electron affinity, it is possible to increase the density of the carrier (electron) in the base layer 23, thus the base resistance being reduced. As a result, the ohmic contact with the base layer 23 can be carried out properly and the base voltage can be properly applied to the whole base area. Further, if the amount of the carrier in this base layer 23 is selected to be substantially the same as the prior art, it is possible to reduce the base width, or the thickness of the base layer 23 much more. Thus, the current gain β can be increased.

As earlier noted, when the Γ band in the base layer 23 is lowered, the barrier height h of the collector barrier layer 24 can be made sufficiently large. Accordingly, while the breakdown voltage is increased, it becomes possible to prevent the collector current from depending on only the electron at the L band and the X band, or to prevent the scattering probability from being increased and, thus the current gain β can be increased.

An embodiment of the semiconductor device or hot electron transistor (HET) of this invention will be described more fully with reference to FIG. 6. In this embodiment, as shown in FIG. 6 there is provided a semiconductor substrate, for example, an n-type GaAs single crystalline substrate, which will form the collector layer 25. On this semiconductor substrate, there are sequentially formed an intrinsic AlGaAs semiconductor layer which will become the collector barrier layer 24, an n-type InGaAs semiconductor layer which will become the base layer 23, an intrinsic AlGaAs semiconductor layer which will become the emitter barrier layer 22 and an n-type GaAs layer doped with high impurity concentration which will become the emitter layer 21. These layers 24, 23, 22 and 21 can be epitaxially grown on the collector layer 25 in sequence by a series of processes using an MOCVD (metal organic chemical vapor deposition) method, an MBE (molecular beam epitaxy) method and so on. Further, the epitaxial layers of the emitter layer 21 and the emitter barrier layer 22 can, for example, partly be removed by etching technique so as to expose a part of the base layer 23 to the outside at which a base electrode 26 is deposited in ohmic contact therewith. Reference numeral 27 designates an emitter electrode which is deposited on the emitter layer 21 in ohmic contact therewith and reference numeral 28 designates a collector electrode which is deposited on the collector layer 25 in ohmic contact therewith. Reference numerals 30 and 31 respectively designate insulating layers each of which is made of, for example, an oxide layer and the like.

In the embodiment shown in FIG. 6, the collector layer 25 is made of the GaAs substrate itself. In some case, it is possible that, for example, an n-type GaAs substrate doped with high impurity concentration or having low specific resistance is formed and then the collector layer 25 can be grown epitaxially thereon. In this case, the layers 25 to 21 can be grown epitaxially by a series of processes using the MOCVD method or the MBE method, respectively.

EXAMPLE 1

In the semiconductor device with the structure shown in FIG. 6, as the collector layer 25 thereof, an n-type GaAs semiconductor layer doped with high impurity concentration was formed to have a thickness of 5000 Å. On the collector layer 25, there were sequentially formed an intrinsic $Al_{0.2}Ga_{0.8}As$ semiconductor layer (1000 Å). As the collector barrier layer 24, an n-type $In_{0.1}Ga_{0.9}As$ layer (300 Å) as the base layer 23, an intrinsic $Al_{0.5}Ga_{0.5}As$ layer (80 Å) as the emitter barrier layer 22 and an n-type GaAs layer (3000 Å) doped with high impurity concentration as the emitter layer 21, respectively. Then, the barrier height h between the base layer 23 and the collector barrier layer 24 became about 300 meV. Accordingly, the electron of the Γ band can flow over the collector barrier layer 24 to the collector layer 25. If the barrier height h of this value is made, the HET of this example can carry out the transistor operation at least in the low temperature.

EXAMPLE 2

As the collector layer 25, there was formed an n-type GaAs layer doped with high concentration so as to have a thickness of 5000 Å. On this collector layer 25, there were sequentially formed an intrinsic $Al_{0.4}Ga_{0.-}$ 6As layer having a thickness of 1000 Å as the collector barrier layer 24, an n-type $In_{0.2}Ga_{0.8}As$ layer having a thickness of 100 Å as the base layer 23, an intrinsic $Al_{0.5}Ga_{0.5}As$ layer having a thickness of 150 Å as the emitter barrier layer 22 and an n-type GaAs layer doped with high impurity concentration having a thickness of 3000 Å as the emitter layer 21. The barrier height h between the base layer 23 and the collector barrier layer 24 became about 600 meV. According to the HET thus arranged, since the barrier height h is high, the sufficient breakdown voltage can be obtained even at room temperature so that the HET can carry out the room temperature operation. In this example, the barrier height h becomes considerably higher than the energy of the Γ band so that the influences of the X band and the L band become dominant. However, since the thickness of the base layer 23 is reduced to be ⅓ of the thickness of the base layer 23 in the Example 1, it is possible to avoid the current gain β from being lowered. Furthermore, since the electron affinity of the base layer 23 is increased and hence the carrier density therein is increased, it is possible to compensate for the base resistance which is high by reducing the thickness of the base layer 23.

From the comparisons of the Examples 1 and 2, it will be seen that when the added amount of indium In to the base layer 23 is large, it is possible to increase the barrier height h between the collector layer 25 and the collector barrier layer 24 to thereby increase the breakdown voltage. On the other hand, since the barrier height h becomes higher than the level of the Γ band, the influences of the X band and the L band become dominant with the result that the scattering probability of electron is increased, thus lowering the current gain β. Since the base layer 23 has large electron affinity and large carrier density, if the base resistance is constant, the thickness of the base layer 23 can be reduced by the amount corresponding to the increased amount of the carrier density. Thus, it is possible to compensate for or improve the lowered current gain β. Accordingly, by selecting the added amount of indium In to the base layer 23 and the thickness of the base layer 23 in accordance with the purpose of use, mode or the like, the HETs of the examples become able to operate at, for example, room temperature.

When the added amount of indium In to the base layer 23 is increased, a difference of the lattice constant for GaAs becomes large so that lattice mismatching occurs between the base layer 23 and the collector barrier layer 24. There is then a fear that dislocation will occur.

Figure 9:
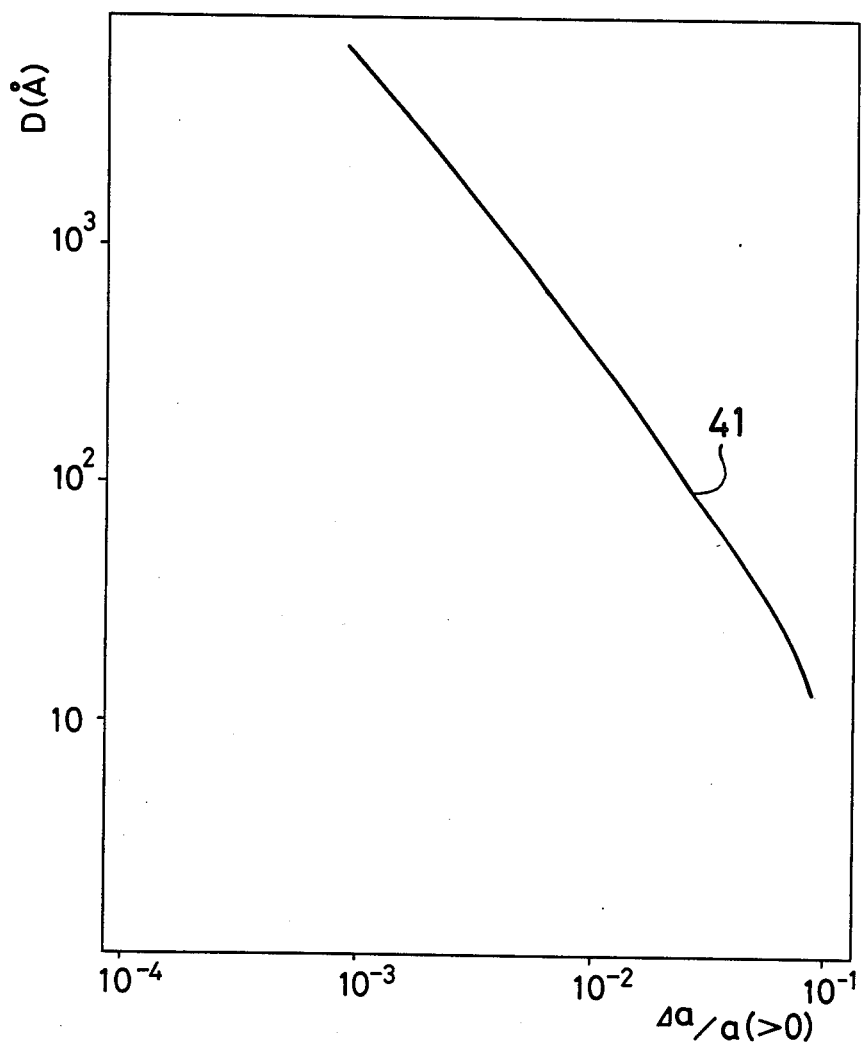
FIG. 9 is a graph showing a relation-ship between a thickness of a layer which causes a dislocation relative to a ratio of a lattice constant and a lattice constant difference.

In the graph of FIG. 9, a curve 41 shows measured results of a relation-ship between a ratio of the lattice constant a relative to the difference Δa between the lattice constant a of the $In_xGa_{1-x}As$ semiconductor layer and a lattice constant of the $Al_yGa_{1-y}As$ semiconductor layer and the layer thickness D in which dislocation begins to appear due to the lattice mismatching. The dislocation does not occur in the left-hand side area of the curve 41, while dislocation occurs in the right-hand side area thereof. For example, since the lattice mismatching, or Δa/a between the $Al_{0.4}Ga_{0.6}As$ and $In_{0.2}Ga_{0.8}As$ is about 1.4%, the maximum thickness of the layer as laminated by the epitaxial growth process without causing any defects is about 200 Å. Accordingly, when the thickness D is increased more than the above value, there is a fear that the dislocation will occur. As a result, when it is desired to increase the thickness of the base layer in accordance with the purpose of use in a standpoint of, for example, a base spreading resistance or the like, such defect as dislocation will become a serious problem. If the base layer is formed as the strained super lattice structure even when the thickness of the base layer is made large enough, it becomes possible to avoid such defects as the dislocation or the like from being caused by the lattice mismatching. This example will be described.

EXAMPLE 3

In this example, the collector layer 25 is formed on n+-GaAs with a thickness of 3000 to 5000 Å, the collector barrier layer 24 is formed of an intrinsic $Al_{0.15}Ga_{0.85}As$ semiconductor layer having a thickness of 1000 Å, and the base layer 23 is the multilayer formed by alternately laminating atomic layers of $In_{0.2}Ga_{0.8}As$ and GaAs, with its layer adjacent to the collector barrier layer 24 and the emitter barrier layer 22 being formed of $In_{0.2}Ga_{0.8}As$. An n-type impurity doping can be carried out only on the GaAs layer. The emitter barrier layer 22 is formed of an intrinsic $Al_{0.3}Ga_{0.7}As$ layer having a thickness of 100 to 200 Å and the emitter layer 21 is formed of an n-type GaAs semiconductor layer doped with high impurity concentration and with a thickness of 3000 Å. The thickness of each of the InGaAs layer and the GaAs layer constituting the strained super lattice structure in the base layer 23 is selected to be in a range from 50 to 100 Å, to thereby afford the total thickness ranging from 300 to 500 Å.

Figure 10:
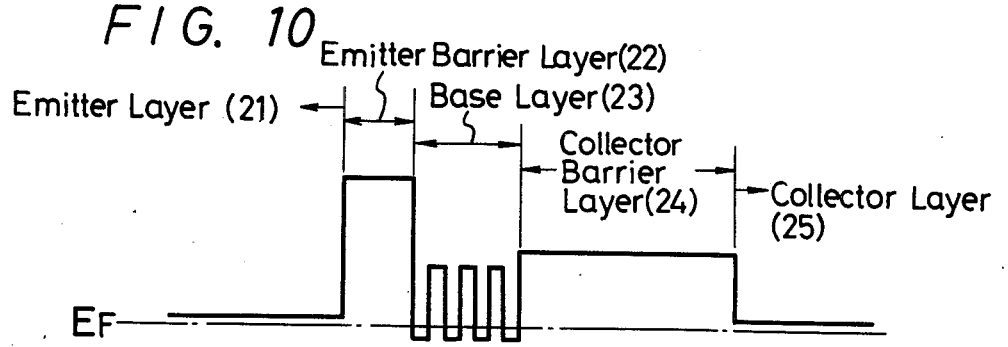
FIG. 10 is a diagram schematically showing other conduction band energy of the semiconductor device of this invention.

FIG. 10 shows a model of the energy level of the conduction band of the semiconductor device of this example. As shown in FIG. 10, the electron level in the base layer 23 is produced in a potential well of the InGaAs layer and the ground level thereof is produced near the bottom of the potential well. Accordingly, the substantial barrier height h of the collector barrier is generated in correspondence with the difference between the bottoms of the conduction bands of the InGaAs layer and the collector barrier layer 24.

When the base layer 23 is formed so as to have the super lattice structure, the freedom in the designing the same depends on the value x in the $In_xGa_{1-x}As$ layer and the GaAs layer being selected so as to satisfy the conditions of $0 < X \leq 1$, the layer thickness, the number of the periods, and so on. In this case, the thickness of each layer and the number of laminated layers are not restricted. It is desired that the thickness of the base layer 23 is selected such one as to prohibit the hot electron from being scattered to lose its energy, or within several thousands angstroms (Å).

The semiconductor device of this invention is not limited to the above-described examples but can be applied, for example, to a semiconductor device previously proposed by the present applicant (disclosed in Japanese patent application No. 82807/1983). Such previously proposed semiconductor device will hereinafter be described briefly.

The semiconductor device disclosed in Japanese patent application No. 82807/1983 relates to a logic circuit, for example, an inverter circuit which is formed of an HET. That is, in view of the fact that the parasitic capacitance between the high speed logic element HET and the load resistance becomes a main factor which lowers the switching speed of the logic element, the HET structure is provided with another tunnel barrier. Accordingly, for example, an inverter circuit in which the resistance by the tunnel barrier is used as a load resistance is constructed so as to avoid the switching speed from being lowered due to the parasitic capacitance or to exhibit various functions so as to take the use of various modes.

Figures 11, 12:
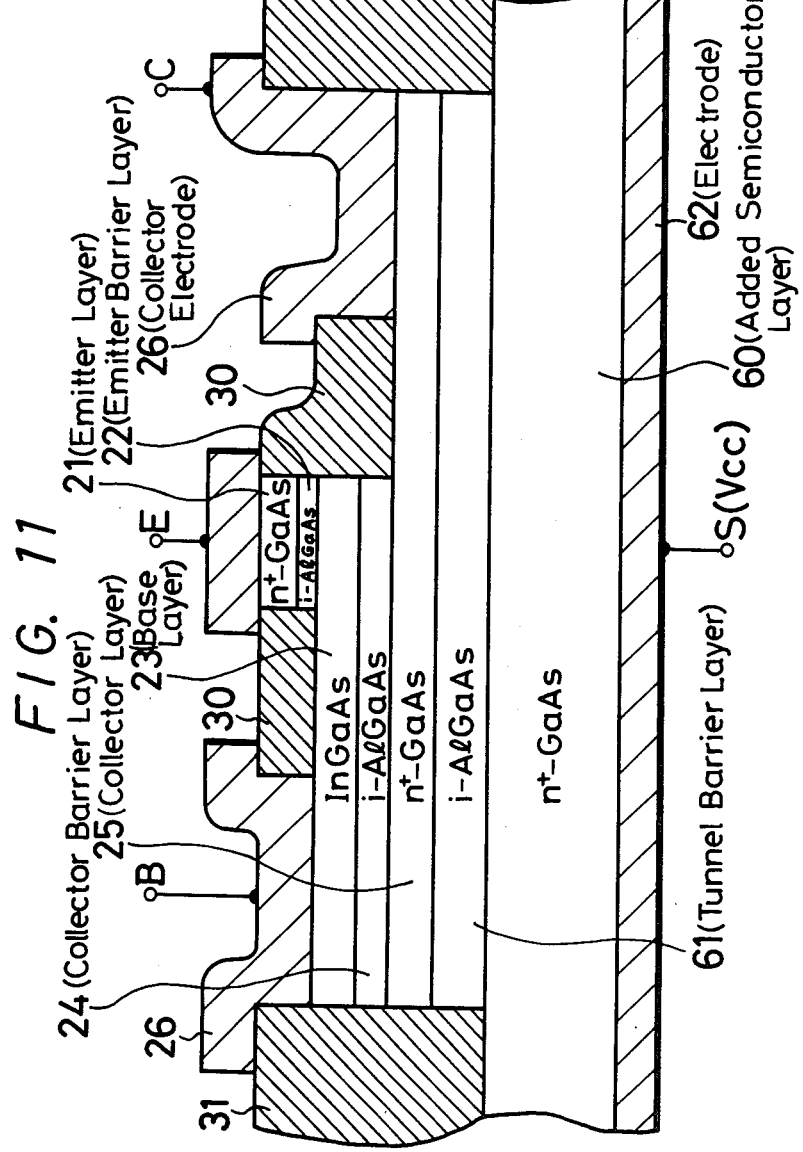
FIG. 11 is an enlarged cross-sectional view schematically illustrating another embodiment of the semiconductor device according to this invention.
FIG. 12 is a diagram showing an equivalent circuit of the semiconductor device of FIG. 11.

An example of such previously proposed semiconductor device will be described with reference to FIG. 11. In FIG. 11, like parts corresponding to those of FIG. 6 are marked with the same references and will not be described in detail.

In this embodiment, on an added semiconductor layer 60 made of an n+- GaAs substrate, there is formed, for example, an intrinsic AlGaAs tunnel barrier layer 61 on which the collector layer 25, the collector barrier layer 24, the base layer 23, the emitter barrier layer 22 and the emitter layer 21 are grown in sequential epitaxy by the similar MOCVD method, MBE method and the like. Then, the layers 21 to 24 are etched away so as to expose a part of the collector layer 25 to the outside on which the collector electrode 26 is deposited in ohmic contact therewith. An electrode 62 is deposited in ohmic contact on the added semiconductor layer 60 from which a terminal S is led out.

FIG. 12 is a diagram showing an equivalent circuit of this semiconductor device from which it will be seen that this semiconductor device becomes an inverter circuit which comprises an HET element T formed of the emitter layer 21, the emitter barrier layer 22, the base layer 23, the collector barrier layer 24 and the collector layer 25 and a load resistor R formed of a resistor of the tunnel barrier layer 61.

FIGS. 13A and 13B are respectively diagrams showing the energy model of the conduction band of the semiconductor device of FIG. 11. FIG. 13A shows a state that no voltage is applied to the semiconductor device, and in FIG. 13B, a solid line (bold line) indicates a state that the voltage Vcc is applied between the terminals E and S while a broken line in the same figure indicates a state that the on-state voltage $V_{BE}$ is applied between the terminals B and E. In this case, the load resistance R is presented by the tunnel barrier layer 61.

This tunnel barrier resistance will be considered. If, now, the GaAs/AlGaAs/GaAs semiconductor system is considered a current I versus voltage V characteristic thereof is varied with the barrier height h, the barrier width and so on. Accordingly, when the barrier height h, the barrier width and so on are selected properly, a resistance defined by R=V/I is given a current dependency so that the resistance R with this structure becomes a nonlinear resistance. That is, FIG. 14 is a graph showing the output characteristic of the inverter, in which a load curve by the tunnel barrier resistance becomes as shown by a curve 91. In FIG. 14, curves 92 and 93 indicate collector current Ic versus emitter - collector voltage $V_{CE}$ characteristic presented when the HET element in this semiconductor device is turned on and off, respectively. Thus, two logic outputs $V_0$ and $V_1$ are obtained.

As described above, the present invention can be applied to the HET of this complex structure. Even in this case, the base layer 23 in the HET portion can be formed as the layer containing idium In which has large electron affinity or as the strained super lattice structure containing the element.

As set forth above, according to the present invention, since the base layer is added with indium In to be a layer which is large in electron affinity, it is possible to increase the carrier density thereof. As a result, when the thickness of the base layer is made constant, it is possible to reduce the base resistance thereof, whereby the base voltage can be applied to the whole base area positively. Further, the ohmic contact with this base layer can be carried out properly and easily.

When the base resistance is made constant, the carrier density therein is increased so that the thickness of this base layer can be reduced, thus the transfer ratio to the collector layer being increased and hence the current gain $\beta$ being also increased.

Furthermore, since the barrier height h of the collector barrier layer can be increased as set forth above, the breakdown voltage can be increased so that the semiconductor device of this invention can carry out the operation at the room temperature or high temperature near the room temperature. Thus, this invention can afford great advantages in practice.

The above description is given on the preferred embodiments of the invention, but it will be apparent that many modifications and variations could be effected by one skilled in the art without departing from the spirits or scope of the novel concepts of the invention, so that the scope of the invention should be determined by the appended claims only.

We claim as our invention:
1. A III-V semiconductor device comprising:
an emitter region;
an emitter barrier region adjacent said emitter region and having such a barrier height so as to substantially restrict thermionic emission current as compared with tunneling current and having a barrier width so as to permit tunneling current;
a base region adjacent said emitter barrier region and containing indium and having a higher electron affinity than said emitter region;
and said base and emitter regions formed of compounds having the form of $In_x (Al_y Ga_{1-y})_{1-x} P_z As_{1-z}$ where $0<x\leq 1$ and $0\leq y<1$ and x is the base region is selected to be larger than x in the emitter region;
a collector barrier region adjacent said base region and having a barrier height so as to substantially prohibit thermally disturbed electrons from overflowing and having a barrier width so as to substantially prohibit said tunneling current and a collector region adjacent said collector barrier region; and, in which said emitter region is GaAs, said emitter barrier region is $A_x Ga_{1-x} As$, said base region is $In_y Ga_{1-y} As$, said collector barrier region is $A_z Ga_{1-z} As$ and said collector region is GaAs.

* * * * *